US010443129B2

(12) United States Patent
Mori et al.

(10) Patent No.: US 10,443,129 B2
(45) Date of Patent: Oct. 15, 2019

(54) EPITAXIAL GROWTH DEVICE

(71) Applicant: APPLIED MATERIALS, INC., Santa Clara, CA (US)

(72) Inventors: Yoshinobu Mori, Ohmura (JP); Akira Okabe, Ohmura (JP)

(73) Assignee: Applied Materials, Inc., Santa Clara, CA (US)

( * ) Notice: Subject to any disclaimer, the term of this patent is extended or adjusted under 35 U.S.C. 154(b) by 331 days.

(21) Appl. No.: 13/762,176

(22) Filed: Feb. 7, 2013

(65) Prior Publication Data

US 2014/0116340 A1 May 1, 2014

(30) Foreign Application Priority Data

Oct. 26, 2012 (JP) ................................ 2012-237109

(51) Int. Cl.
| C23C 16/44 | (2006.01) |
| C30B 25/14 | (2006.01) |
| C23C 16/46 | (2006.01) |
| C23C 16/455 | (2006.01) |
| C23C 16/458 | (2006.01) |
| C23C 16/48 | (2006.01) |
| C30B 29/06 | (2006.01) |

(52) U.S. Cl.
CPC .......... *C23C 16/46* (2013.01); *C23C 16/4585* (2013.01); *C23C 16/45502* (2013.01); *C23C 16/481* (2013.01); *C30B 25/14* (2013.01); *C30B 29/06* (2013.01)

(58) Field of Classification Search
CPC .......... C23C 16/45504; C23C 16/4585; C23C 16/481; C23C 16/45502; C23C 16/4558; C23C 16/466; C23C 16/4551; C23C 16/45508; C23C /; C30B 25/14; H01L 21/68735
USPC ................... 118/715–733; 156/345.1–345.55
See application file for complete search history.

(56) References Cited

U.S. PATENT DOCUMENTS 4,547,279 A * 10/1985 Kiyota ................ H01J 37/3423
204/192.12
5,024,716 A * 6/1991 Sato ........................ B05D 3/14
118/50.1

(Continued)

FOREIGN PATENT DOCUMENTS

JP 2004-063779 A 2/2004
JP 2005-307238 A 11/2005
(Continued)

OTHER PUBLICATIONS

International Search Report, JP2013/079126, dated Jan. 28, 2014.
(Continued)

*Primary Examiner* — Charlee J C Bennett
(74) *Attorney, Agent, or Firm* — Patterson + Sheridan, LLP

(57) ABSTRACT

An epitaxial growth device comprises a reaction chamber defined by a substrate setting portion, a ceiling board and a sidewall portion, a heating member and reactant gas-introduction member. The ceiling board is fixed to a ring-like support portion having a through-hole as viewed from above. A diameter of the through-hole becomes reduced gradually toward a substrate-side. The ceiling board is fixed to an end portion of the substrate-side of the through-hole.

20 Claims, 8 Drawing Sheets

(56) References Cited

U.S. PATENT DOCUMENTS

| | | | | |
|---|---|---|---|---|
| 5,964,947 | A * | 10/1999 | Zhao | C23C 16/4411 118/715 |
| 6,099,648 | A * | 8/2000 | Anderson | C30B 25/08 118/715 |
| 6,454,863 | B1 * | 9/2002 | Halpin | C23C 16/4584 118/715 |
| 6,500,734 | B2 * | 12/2002 | Anderson | C23C 16/45504 438/478 |
| 8,980,005 | B2 * | 3/2015 | Carlson | C23C 16/4404 118/715 |
| 2001/0037771 | A1 * | 11/2001 | Chen et al. | 118/728 |
| 2002/0185062 | A1 * | 12/2002 | Halpin | C23C 16/4584 118/50.1 |
| 2004/0144323 | A1 | 7/2004 | Kai | |
| 2005/0106524 | A1 * | 5/2005 | Ose | H01L 21/67103 432/247 |
| 2007/0281084 | A1 * | 12/2007 | Hirosawa | C23C 16/45565 427/248.1 |
| 2008/0179290 | A1 * | 7/2008 | Collins | H01J 37/32357 216/67 |
| 2010/0015402 | A1 * | 1/2010 | Brenninger | C23C 16/24 428/172 |
| 2014/0290573 | A1 * | 10/2014 | Okabe | H01L 21/02617 118/500 |
| 2015/0122181 | A1 * | 5/2015 | Okabe | H01L 21/02617 118/729 |

FOREIGN PATENT DOCUMENTS

| | | |
|---|---|---|
| JP | 2006-049503 A | 2/2006 |
| JP | 2007-324286 A | 12/2007 |
| TW | 200302525 A | 8/2003 |

OTHER PUBLICATIONS

European Patent Office Search Report dated Jun. 14, 2016, for EPO Application No. 13848894.5.

Chinese Search Report for Application No. 201380054803.9 dated Jul. 24, 2017.

Chinese Search Report for Application No. 201380054803.9 dated Nov. 23, 2017.

* cited by examiner (1)

(2)

EPITAXIAL GROWTH DEVICE

BACKGROUND

1. Field of the Invention

The present invention relates to an epitaxial growth device.

2. Technical Background

Conventionally, a device, as an epitaxial growth device for growing an epitaxial film on a substrate using an epitaxial growth method, comprising a process chamber and a rotatable substrate support portion which is located in the process chamber and rotates the substrate about a rotation axis is known (as disclosed in Japanese Unexamined Patent Application Publication No. 2001-520456, for example). According to this device, a reactant gas is introduced parallel to a horizontal direction of the substrate so that a film is deposited on the substrate set on the substrate support portion.

For foregoing epitaxial growth device, speeding up of a growth rate is now required further. In this case, including a first material gas in large quantity in the reactant gas to make the growth rate faster is undesirable because a cost of deposition increases and particles increase.

An object of the present invention is to solve the aforementioned problems and provide an epitaxial growth device for improving the growth rate.

SUMMARY

An epitaxial growth device of the present invention in accordance with the present invention comprises: a reaction chamber defined by a substrate setting portion on which a substrate is to be set, a ceiling board which transmit light, and a sidewall portion, the ceiling board being fixed to a ring-like support portion having a through-hole as viewed from above, which is provided on the sidewall portion, a diameter of the through-hole becoming reduced gradually toward a substrate-side, the ceiling board being fixed to an end portion of the ring-like support portion at the substrate-side of the through-hole; heating unit located outside of the reaction chamber for heating the substrate set inside of the reaction chamber via the ceiling board; and reactant gas-introduction unit for introducing reactant gas into the reaction chamber in a direction parallel to a horizontal direction of the substrate. A distance between a center of the ceiling board and the substrate setting portion may be less than 10 mm. In the present invention, when the distance between the center of the ceiling board and the substrate setting portion is less than 10 mm, diffusion of a boundary layer can be suppressed when the reactant gas is introduced into the reaction chamber so that a growth rate becomes improved.

The ceiling board may be fixed to a ring-like support portion having a through-hole as viewed from above and a diameter of the through-hole may become reduced gradually toward a substrate-side and the ceiling board may be fixed to an end portion of the substrate-side of the through-hole. Since the support portion may have the ring-like shape, the ceiling board can be supported when a heat stress is high so the distance between a center of the ceiling board and the substrate setting portion is less than 10 mm.

The sidewall portion may have a supply passage for supplying the reactant gas into the reaction chamber and the supply passage may have a wall which the reactant gas introduced from the reactant gas-introduction unit collides against and rectification grooves may be provided in at least both ends of the wall along a direction of a flow of the reactant gas. The rectification grooves can improve a rectilinear property of the reactant gas which is decreased when the distance between a center of the ceiling board and the substrate setting portion is less than 10 mm.

A rectification plate having holes provided in line longitudinally may be provided to face the wall and the rectification grooves face to the holes respectively. This configuration can further enhance a function of rectification.

The rectification plate may be divided into a plurality of areas where the holes are provided and the rectification grooves are provided corresponding to the holes of outmost end portions among the plurality of areas. This configuration can further enhance the function of rectification.

Centers of the rectification grooves may be provided to go up to the center of the sidewall portion having a ring-like shape respectively. This configuration can further enhance the function of rectification.

A susceptor ring may be provided around the substrate setting portion, the susceptor ring may be constructed of a first ring and a second ring, the first ring may be distantly provided in outer circumference of the susceptor and the second ring may be set on an opened depressive portion provided in inner circumference of the first ring. This configuration can decrease an escape of the reactant gas.

The second ring may be provided to approach a space formed between the susceptor and the first ring. This configuration can reduce a wraparound of the reactant gas.

The second ring may be provided to cover the space formed between the susceptor and the first ring. This configuration can further reduce a wraparound of the reactant gas.

Figure 1:
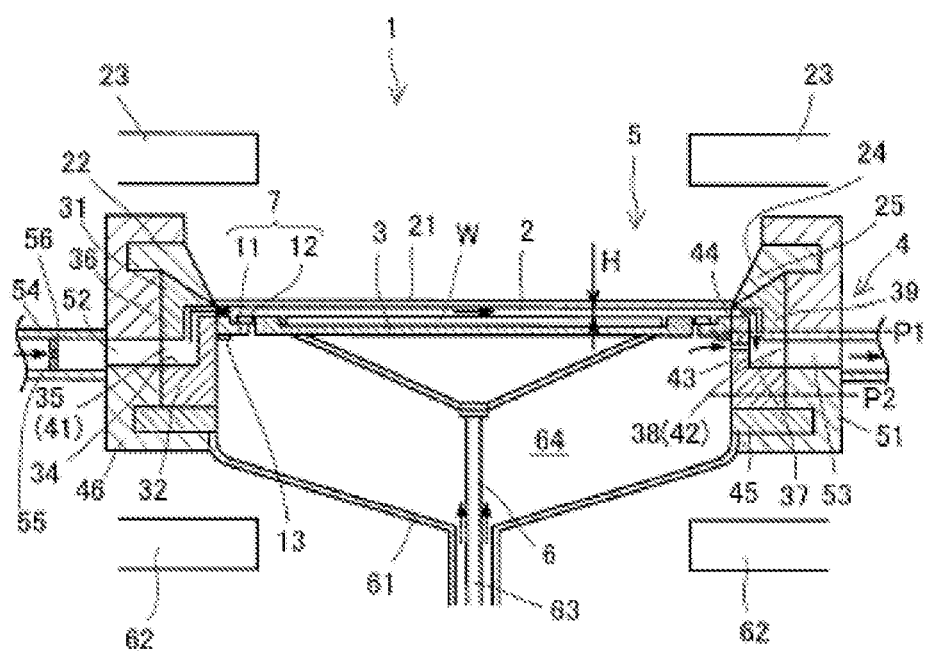
FIG. 1 is a cross-section view showing whole epitaxial growth device.
Figure 2:
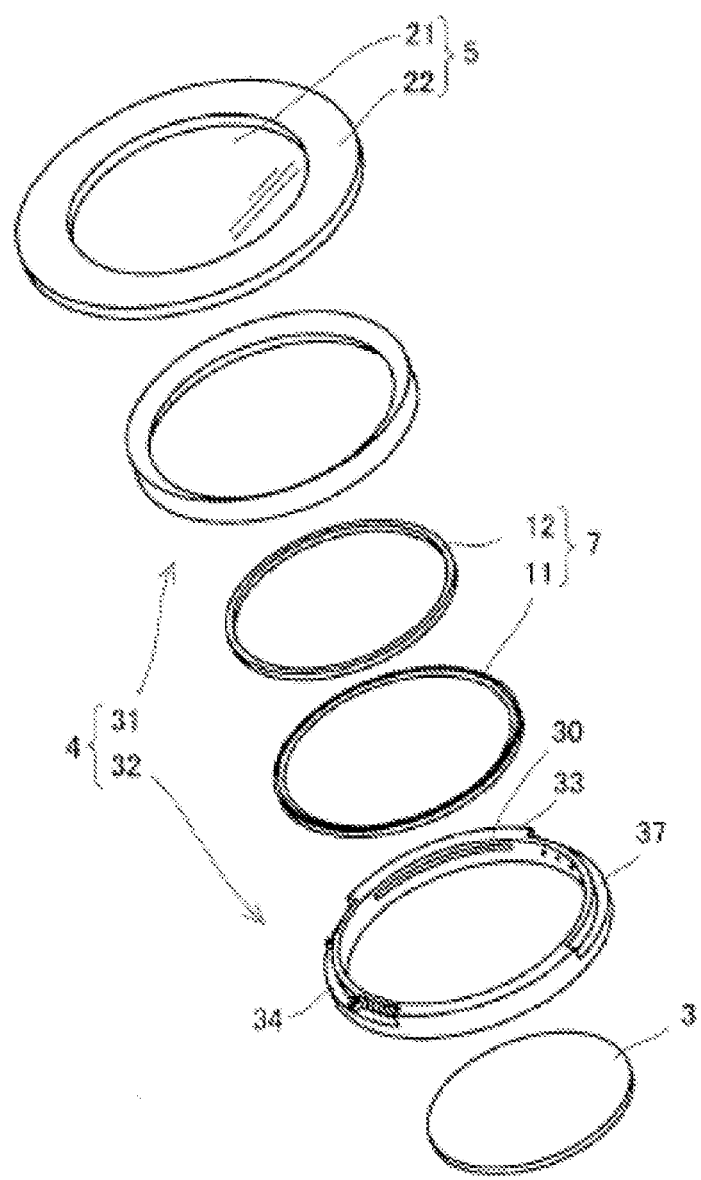
FIG. 2 is an exploded perspective view of an epitaxial growth device for describing a reaction chamber.

DETAILED DESCRIPTION OF THE PREFERRED EMBODIMENTS (First Embodiment) A first embodiment of an epitaxial growth device of the present invention will be described with reference to FIG. 1 and FIG. 2.

An epitaxial growth device 1 is a deposition device for epitaxial growing a film such as silicon on a substrate W.

The epitaxial growth device 1 has a reaction chamber 2. The reaction chamber 2 consists of a susceptor 3 on which a substrate W is set, a sidewall portion 4 and a ceiling 5.

The susceptor 3 has a disciform shape as viewed from above and is slightly larger than the substrate W. The susceptor 3 is provided with a depressed portion 3a to set the substrate W thereon. A susceptor support portion 6 having a plurality of arms supports the susceptor 3. Supporting the susceptor 3, the susceptor support portion 6 moves up and down from a depositing position P1 to a substrate-transferring position P2. A film is deposited on the substrate W in the depositing position P1 and the substrate is transferred into and from the epitaxial growth device 1 in the substrate-transferring position P2. The susceptor support portion 6 rotates in the deposition position P1 so that the substrate W is rotated in the deposition position P1. Moreover, a diameter of each arm of the susceptor support portion 6 is smaller than normal one. This configuration can suppress the shielding of heat from a heating member 62 described below by the susceptor support portion 6 to make small a difference of a radiation heat in the susceptor 3 by the susceptor support portion 6, and reduce the heat getting away from the susceptor 3 to the susceptor support portion 6 so that a temperature distribution of the susceptor 3 can be homogenized.

A ring-like susceptor ring 7 is provided around the susceptor 3 positioned in the depositing position P1. The susceptor ring 7 consists of a first ring 11 and a second ring 12 set on the first ring 11 described hereinafter in detail. The susceptor ring 7 is supported by a flange 13 provided to the sidewall portion 4 of the reaction chamber 2.

The ceiling portion 5 consists of a ceiling board 21 and a support portion 22 supporting the ceiling board 21. The ceiling board 21 has a translucency to transmit heat from a heating member 23 (such as a halogen lamp) provided above the ceiling board 21, therefore an inside of the reaction chamber can be heated. That is, the epitaxial growth device 1 in the first embodiment is a cold-wall type epitaxial growth device. In the first embodiment, quartz is used as the ceiling board 21.

The support portion 22 supporting the ceiling board 21 has a ring-like structure. A through-hole is formed in the support portion 22 and a diameter of the through-hole is reduced gradually toward a substrate side. The ceiling board 21 is fixed to an end portion of the substrate side on the surface of the through-hole. A method of the fixation includes a welding. The support portion 22 has a projection portion 25 projecting toward an inner periphery of the support portion 22 as viewed from backside (underside). A diameter of this projection portion 25 is reduced gradually along the direction of the projection. Thus the support portion 22 has two inclining face portions.

The sidewall portion 4 consists of a ring-like upper sidewall portion 31 and a ring-like lower sidewall portion 32. The flange 13 described above is provided on the inner surface of the lower sidewall portion 32. A substrate transferring opening 30 is provided on a lower side of the flange 13.

The upper sidewall portion 31 has an incline on an upper surface thereof corresponding to the projection portion 25 of the support portion 22 described above. The upper sidewall portion 31 and the support portion 22 are fitted each other with the inclines.

A part of outer peripheral portion of the upper face of the lower sidewall portion 32 is cut off to form a cutout. A region where the cutout is not provided is a setting surface 33 on which the upper sidewall portion 31 is set. The cutout of the under sidewall portion 32 forms a first depressive portion 34 in the under sidewall portion 32. That is, the first depressive portion 34 is a depressive portion formed in a region where the setting surface 33 of the upper surface of the under sidewall portion 32 is not formed. The upper sidewall portion 31 is provided with a first projection portion 36. The first projection portion 36 has a shape corresponding to a shape of the first depressive portion 34 in a position corresponding to the first depressive portion 34. A gap 35 is formed between the first depressive portion 34 and the first projection portion 36 when the upper sidewall portion 31 is set on the under sidewall portion 32. The gap 35 between the first projection portion 36 and the first depressive portion 34 serves as a reactant gas supply passage 41 (a supply passage) described hereinafter in detail.

On an outer periphery of an upper surface of the under sidewall portion 32, a cutout is provided partially at an opposite side of a region where the first depressive portion 34 is provided. The cutout forms a second depressive portion 37. The upper sidewall portion 31 is provided with a second projection portion 39. The first projection portion 39 has a shape corresponding to a shape of the second depressive portion 37 in a position corresponding to the second depressive portion 37. A gap 38 is formed between the second depressive portion 37 and the second projection portion 39 when the upper sidewall portion 31 is set on the under sidewall portion 32. The gap 39 between the second projection portion 39 and the second depressive portion 37 serves as a gas exhaust passage 42.

Therefore since the reactant gas supply passage 41 and the gas exhaust passage 42 are formed to face each other in the reaction chamber 2, reactant gas flows parallel to a horizontal direction of the substrate W in the reaction chamber 2.

A wall surface 43 configuring the second depressive part 37 of the under sidewall portion 32 is provided with a purge hole 44 where purge gas is exhausted. The purge hole 44 is formed below the flange 13. Since the purge hole 44 is provided to the wall surface 43 configuring the second depressive part 37, the purge hole 44 connects to the gas exhaust passage 42. Therefore, both the reactant gas and the purge gas are exhausted in the gas exhaust passage 42.

On the undersurface side of the sidewall portion 4, a ling-like setting board 45 where the sidewall portion 4 is set is provided.

In outside of the ceiling 5, the sidewall portion 4 and the setting board 45, a ring-like clamping part 51 is provided. The clamping part 51 clamps and supports the ceiling 4, the sidewall portion 4 and the setting board 45. The clamping part 51 is provided with a supply-side communication passage 52 communicated with the reactant gas supply passage 41 and an exhaust-side communication passage 53 communicated with the gas exhaust passage 42.

The supply-side communication passage 52 is provided with a reactant gas introduction part 54. In the first embodiment, a first material gas and a second material gas are introduced from the reactant gas introduction part 54. The second material gas may serves as carrier gas. As the reactant gas, a mixture of more than two type of gas may be used. The reactant gas introduction part 54 is provided with a rectification plate 55 perpendicular to a gas flow passage. A plurality of holes 56 is provided to the rectification plate 55 in line along a circumferential direction. When the reactant gas flows through the holes 56, the first material gas and the second material gas are mixed and rectified. The exhaust-side communication passage 53 is provided with a gas exhaust part 57. That is, the reactant gas passage 41 is provided with the reactant gas introduction part 54 via the supply-side communication passage 52. Moreover, the gas exhaust passage 42 is provided with the gas exhaust part 57 via the exhaust-side communication passage 53. The gas exhaust passage 42 is formed so that a flow passage faces to a center of the reaction chamber 2.

A device bottom 61 is provided under an inner circumference of the setting board 45. In outside of the bottom 61, another heating member 62 is provided. The heating member 62 can heat the substrate W from the bottom.

A shaft 63 of the susceptor support portion 6 is inserted into a center of the device bottom 61, and a purge gas introduction part (not shown) through which the purge gas is introduced is provided in the center of the device bottom 61. The purge gas is introduced from a purge gas introduction unit (not shown) provided to the purge gas introduction part to a reaction chamber bottom 64 defined the device bottom 61, the under sidewall portion 32 and the setting board 45. The purge hole 44 described above communicates with the reaction chamber bottom 64.

A deposition method is described using the epitaxial growth device of the first embodiment.

After the susceptor 3 is moved to the substrate-transfer position P2 and the substrate W is transferred from the substrate transferring opening 30 to the susceptor 3, the susceptor 3 is moved to the depositing position P1. For example, a silicon substrate having a diameter of 200 mm is used as the substrate W. Then, the purge gas (such as hydrogen gas) is introduced to the reaction chamber bottom 64 from the purge gas introduction part while heated by the heating member 23 and heating member 62. Further, the reactant gas (such as trichlorosilane gas for the first material gas and hydrogen gas for the second material gas) is introduced into the reaction chamber 2 from the reactant gas introduction part 54 via the reaction gas supply passage 41. The reactant gas forms a boundary layer on a surface of the substrate W and a reaction is implicated in the boundary layer. Thus, a silicon layer is deposited on the substrate W. The reactant gas is exhausted from the gas exhaust passage 42 connected to the reaction chamber 2. The purge gas is exhausted to the gas exhaust passage 42 via the purge hole 44.

In accordance with the epitaxial growth device of the first embodiment, since the support portion 22 supports the ceiling board 21, a distance H between a chamber-side surface of the center of the ceiling board 21 and the substrate W can be less than 10 mm. As a result, since the epitaxial growth device 1 can suppress diffusion of the boundary layer, which is formed by the reactant gas flowing between the ceiling board 21 and the susceptor 3, to a ceiling side, the boundary layer becomes thin. Therefore, a gas velocity in the boundary layer is increased, and as a result, a gas density is increased to enhance reaction efficiency in the surface of the substrate W. Thus, according to the epitaxial growth device 1, a growth rate can be improved.

The distance H between the ceiling board 21 and the substrate W is less than 10 mm. Preferably, the distance H between the ceiling board 21 and the substrate W is less than 10 mm and a distance between a surface of a layer deposited on the substrate and the ceiling board 21 is equal to or more than 1 mm. This range is preferable because the range can make a gas flow of the reaction gas smooth even while the boundary layer is formed.

That is, in the reaction chamber 2 of the first embodiment, the distance between the substrate W and the ceiling board 21 is less than traditional one (having a distance about 20 mm.) By thinning the boundary layer, reaction efficiency in a surface of the substrate is enhanced and therefore the growth rate becomes improved.

In the first embodiment, since the support portion 22 has a shape where a stress does not tend to concentrate, the distance H between the ceiling board 21 and the substrate W can be short, that is, be equal to or less than 10 mm. In particular, infrared light from the heating member 23 goes through the ceiling board 21 roughly and the ceiling board 21 absorbs radiation heat from the susceptor 3 or the substrate W. The absorbed heat is inputted to the support portion 22 from the ceiling board 21 via a joint part with the support portion 22. Especially, in the first embodiment, since the distance H between the substrate W and the ceiling board 21 is short, the radiation heat is absorbed much. Therefore heat inputted to the support portion 22 is larger than ordinal one. Hence, when the support portion 22 has an about right-angled corner, a stress concentrates into this corner so that cracks may accrue.

In the first embodiment, the support portion 22 has a shape having two inclines to set the ceiling board 21 below a position where traditional ceiling board is set so that the ceiling board 21 is supported on a substrate-side of the support portion 22 without the corner where the stress tends to concentrate.

In the first embodiment, the distance H between the substrate W and the ceiling board 21 is short to narrow the boundary layer as referred to above, the reactant gas is easy to escape to out of the substrate W. Since it may be difficult to uniformize a distribution of the thickness of the layer in the substrate, the escape of the reactant gas is preferably prevented. Therefore, in the first embodiment, the reactant gas supply passage 41 is provided with a guide to uniformize a gas flow described below.

Figure 3:
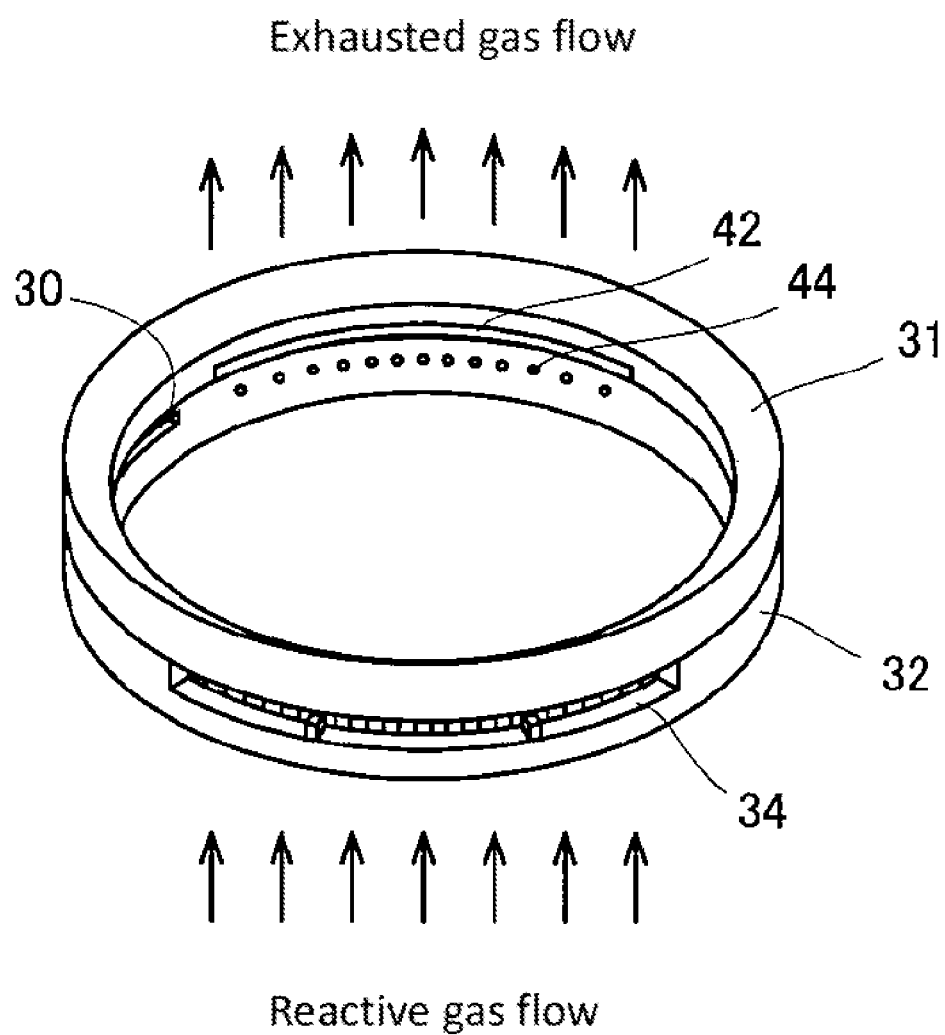
FIG. 3 is a perspective view of an epitaxial growth device for describing a sidewall portion.
Figure 4:
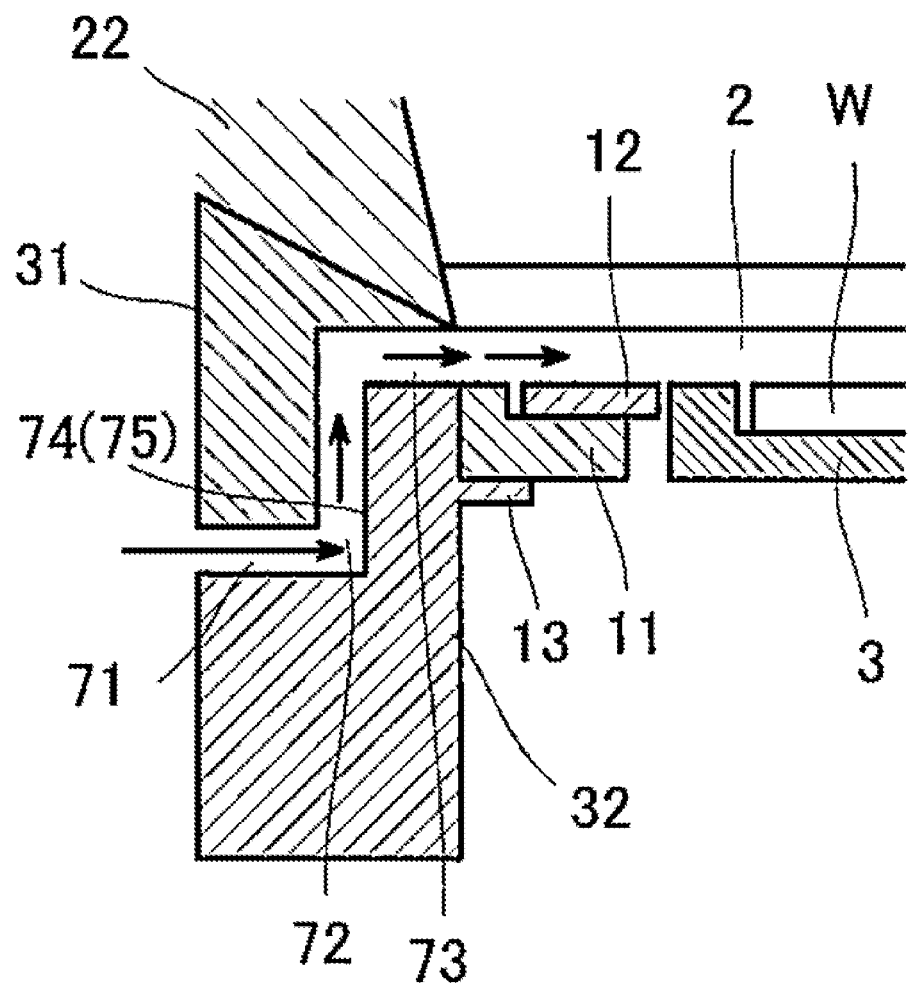
FIG. 4 is a cross-section view of an epitaxial growth device for describing a supply passage.

The guide provided in the reactant gas supply passage 41 is described in detail with reference to FIG. 3 to FIG. 5. The reactant gas supply passage 41 defined by the first depressive portion 34 of the under sidewall portion 32 and the first projection portion 36 of the upper sidewall 31 has a first supply passage 71. The first supply passage 71 connects to the reactant gas introduction part 54 and is provided along a direction of introduction of the gas from the reactant gas introduction part 54. The reactant gas supply passage 41 has a second supply passage 72 and a third supply passage 73. The second supply passage 72 connects to the first supply passage 71 and is provided along a direction perpendicular to a direction of introduction of the gas. The third supply passage 73 connects to the second supply passage 72 and is provided along a direction of introduction of the gas. The third supply passage 73 connects to the reaction chamber 2.

Since the second supply passage 72 is provided along the direction perpendicular to the direction of introduction of the gas as described above, the gas introduced from reactant gas introduction part 54 contacts to a wall surface 74 facing the reactant gas introduction part 54 of the second supply passage 72. Hence, the reactant gas is diffused and the reactant gas is mixed well. That is, the second supply passage 72 serves as a mixing chamber of the reactant gas. In this case, to prevent the gas from interrupting in the second supply passage 72, in the first embodiment, the wall surface of the second supply passage 72 is provided with rectification grooves 75 elongating vertically. These rectification grooves 75 serve as a guide. Since the rectification grooves 75 are provided as described above, the gas diffused by a contact to the wall surface 74 of the second supply passage 72 can flow into the third supply passage 73 easily. Moreover, since the gas is rectified along the rectification grooves 75, a rectilinear property of the reactant gas is improved and an extensity of the reactant gas is suppressed when the reactant gas flows into the reaction chamber 2.

The rectification grooves 75 is described in detail below. The plurality of rectification grooves 75 are formed continuously as depressive portions in the hole wall surface 74 of the second supply passage 72. As shown in FIG. 5 (2), the rectification groove 75, i.e., the depressive portion, curves in a width direction of the rectification groove 75. In the first embodiment, the rectification groove 75 has an arc-like shape as viewed from upper side. Since the rectification groove 75 curves in a width direction, the reactant gas does not diffuse easily (the reactant gas concentrate easily) when the reactant gas contacts with the wall surface 74, i.e., the bottom of the rectification groove 75, so that the reactant gas has less incidence of spreading out of the substrate W, even when the reactant gas flows into the reaction chamber 2. Although a deep depth of the rectification groove 75 can suppress diffusion, the mixing of the first material gas with the second material gas becomes difficult. Therefore, in the first embodiment, the depth of the rectification groove 75 is 3 mm.

Figure 5:
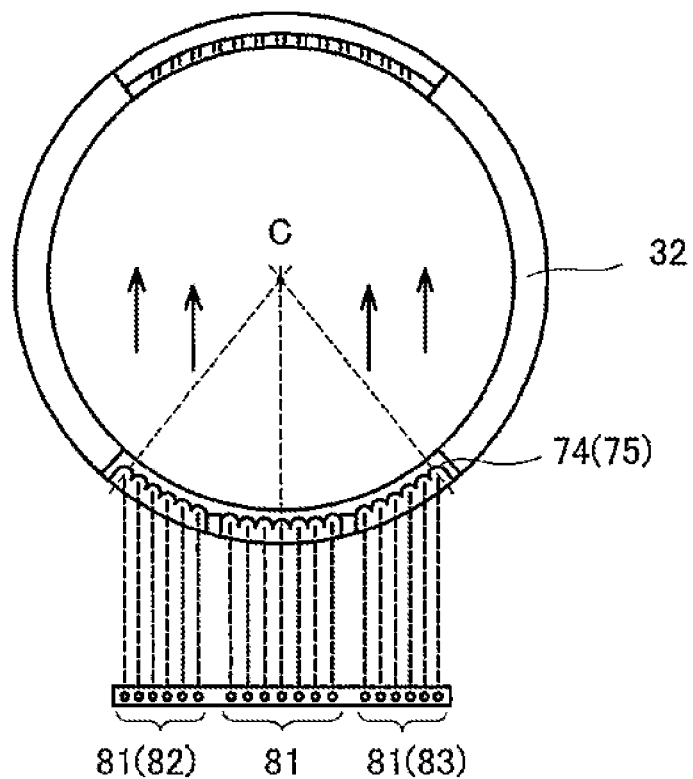
FIG. 5 is a schematic view of an epitaxial growth device for describing a supply passage.
Figure 5:
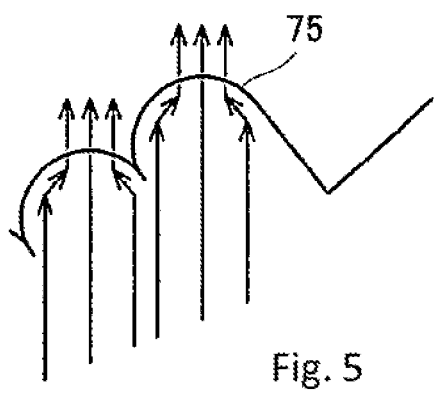
Figure 6:
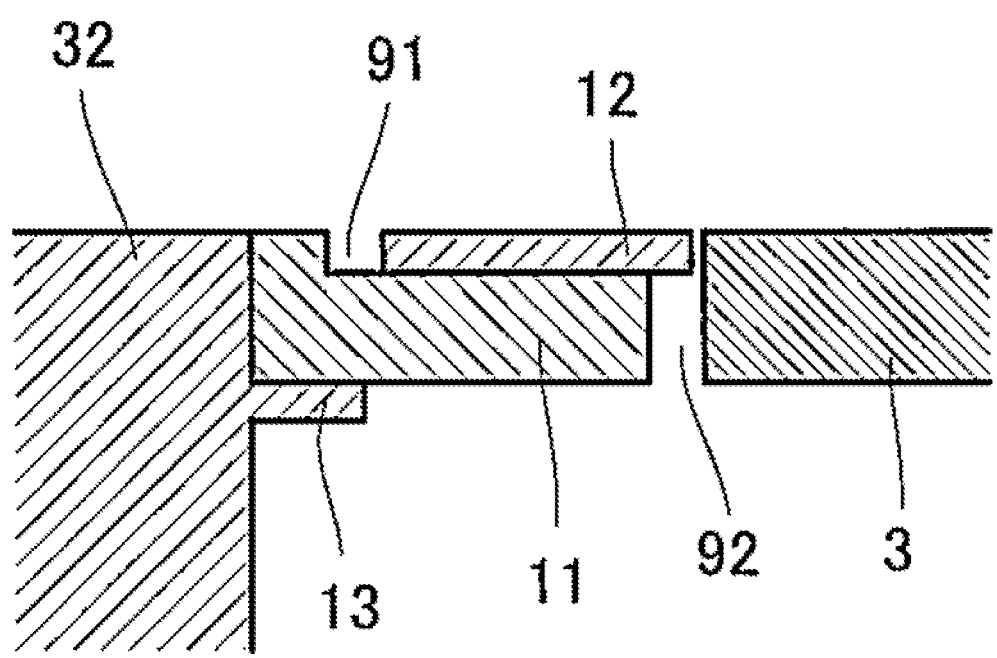
FIG. 6 is a cross-section view of an epitaxial growth device for describing a preheat ring.

Each of the rectification grooves 75 is provided to face toward the center C in the cross section of the lower sidewall portion 32 as shown in FIG. 5 (1). That is, the rectification grooves 75 are provided along the direction of peripheral of the under sidewall portion 32. Therefore, the reactant gas guided by each rectification groove 75 is rectified to flow up to the center side, so that diffusion of the reactant gas in the reaction chamber 2 is suppressed.

Moreover, each rectification groove 75 is provided in a position where the center in a width direction of rectification groove 75 and the center of the hole 56 of the rectification plate 55 provided in the reactant gas introduction part 54 is approximately met (is corresponding). That is, a number of the rectification grooves 75 on the wall surface 74 and a number of the holes 56 are equal in the first embodiment. Therefore, because the reactant gas rectified by the rectification plate 55 flows into each rectification groove 75 directly, the function of rectification is further enhanced so that a rectilinear property of the reactant gas is improved.

Although the rectification grooves 75 are provided over whole surface of the wall surface 74 of the second supply passage 72, the rectification grooves 75 may be provided in at least an end portion of the wall surface 74 of the second supply passage 72. The end portion means a part corresponding to outmost end portions among a plurality of areas which the holes 56 of the rectification plate 55 is divided into. For example, in a case shown in FIG. 5, the rectification plate 55 is divided into three areas 81. The rectification grooves 75 may be provided corresponding to the holes of an outmost end portion 82 and an outmost end portion 83. As described above, as the reactant gas escapes outside of the substrate easily, it is preferably to provide the rectification grooves 75 to the end portion of the reactant gas supply passage 41 to enhance the rectilinear property of the reactant gas especially. This result can be easily achieved by forming the rectification grooves 75 serving as the guide in the case as depressive portions. For example, to provide a rectification member separately in the second supply passage 72 is not preferably because problems of a mix of the reactant gas and a production cost occur. Therefore forming the rectification grooves 75 as the depressive portions is preferably as the first embodiment. An intended result is achieved by rectifying the gas by the rectification grooves 75 so that specific controls of the reactant gas introduction part 54 are not needed.

Moreover, in the first embodiment, since the distance H between the ceiling board 21 and the substrate W is short to narrow the boundary layer as described above, the reactant gas may flow into the reaction chamber bottom and the temperature distribution of the substrate W may not be uniformized, as a result, film thickness distribution in forming of a thick film and film quality (such as distribution of resistivity and occurrence of crystal defects) may be decreased. In the first embodiment, to further prevent above issue, the susceptor ring 7 is constructed by two members described below.

The susceptor ring 7 serves as preheat ring. The susceptor ring 7 is constructed by a first ring 11 and a second ring 12. The first ring 11 is distantly provided in outer circumference of the susceptor 3. An inner circumference of the first ring has a step 91. The second ring 12 is set on the step 91 and approaches a space 92 formed between the first ring 11 and the susceptor 3, therefore the second ring 12 is provided to be out into the space 92. A top surface of the second ring 12 is on the same level with a top surface of the susceptor 3. Since the top surface of the second ring 12 is on the same level with the top surface of the susceptor 3, the reactant gas which is allowed to be maintained in a rectified state mixing in the reactant gas supply passage 41 and like is supplied to the substrate W smoothly with no decrease in speed as far as possible. The top surface of the susceptor 3 here means a top surface of a region where the depressive portion 3a (shown in FIG. 1) is not formed. The second ring 12 in the first embodiment is made from silicon carbide in consideration of heat conductivity.

Since the second ring 12 and the first ring 11 are constructed by different members, the susceptor ring 7 is constructed with accuracy. That is, a distance between the susceptor ring 7 and the susceptor 3 can be reduced to the limit so that a wraparound of the reactant gas to a back side of the substrate W, the reaction chamber bottom 64 can be reduced and can homogenize a temperature distribution of the substrate. Therefore, in the first embodiment, a thickness distribution and a membranous distribution of a deposited layer can be homogenized.

Since the second ring 12 and the first ring 11 are constructed by different members, a transfer of heat between the first ring 11 and the second ring 12 can be suppressed more than if the second ring 12 and the first ring 11 are constructed by same member.

Further, since the second ring 12 approaches a space 92, a leakage of the reactant gas from between the susceptor ring 7 and the susceptor 3 down below when depositing a layer can be decreased so that a flow of the reactant gas does not tend to disturbed. Since the leakage of the reactant gas down below can be decreased, particles can be decreased.

In this case, the second ring 12 is formed to be thinner than the first ring 11. Therefore, a heat loss by a radiation from the susceptor 3 can be suppressed. Moreover, since the second ring 12 is thin, a thermal dose required to maintain the second ring 12 at a prescribed high temperature (preheating) can be small. In another embodiment, when the first ring 11 is made from a material having small heat conductivity, the first ring 11 serves as a heat insulator so that above advantage can be further enhanced.

Also, although the second ring 12 is formed to approach the space 92 in the first embodiment, the present invention is not restricted to this embodiment. When the second ring 12 is at least constructed to set on the step 91 of the first ring 11, the susceptor ring 7 can be constructed with accuracy so that the distance between the susceptor ring 7 and the susceptor 3 can be reduced to the limit Therefore, the wraparound of the reactant gas to a back side of the substrate W can be reduced and can homogenize the temperature distribution of the substrate.

Figure 7:
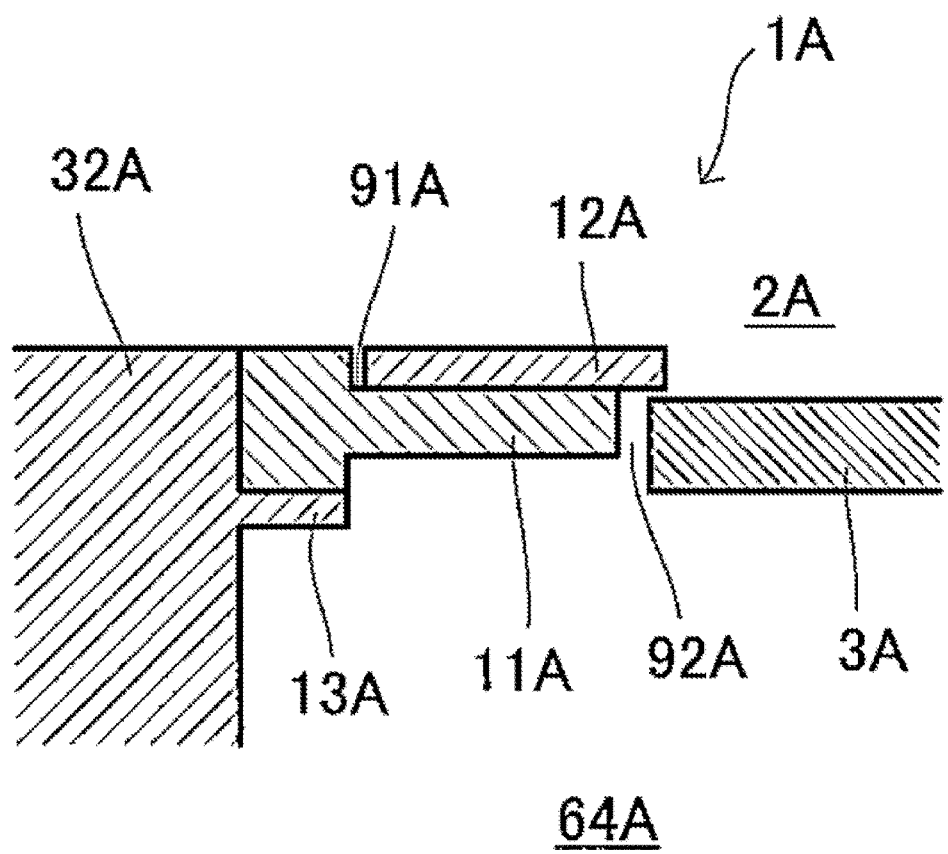
FIG. 7 is a cross-section view of an epitaxial growth device according to a second embodiment.

In the first embodiment, since the distance H between the ceiling board 21 and the substrate W is short to narrow the boundary layer, a ceiling surface of the ceiling board 21 tends to be coated by the reactant gas. If the ceiling surface is coated, the ceiling surface become clouded so that a layer is not deposited efficiently in the cold-wall type epitaxial growth device heating by the heating member 23 via the ceiling board 21. In contrast to this, in the first embodiment, the rectification groove 75 is provided on the wall surface of the reactant gas supply passage 41 as described above and the susceptor ring 7 is constructed by the two members. Therefore, the reactant gas cannot interrupt very well in the reaction chamber as a result an adhesion of a coat material is suppressed. Herewith, the layer can be continuously deposited efficiently (Second Embodiment) A second embodiment of the present invention is described below in accordance with FIG. 7.

In an epitaxial growth device 1A of the second embodiment, it is different from the first embodiment that a second ring 12A is provided to cover a space 92A. In the second embodiment, a first ring 11A is set on a flange 13A of a sidewall portion 32A.

The second ring 12A is set on a step 91A of the first ring 11A and an inner peripheral of the second ring 12A approaches to an outer peripheral of a susceptor 3A.

In second embodiment, since the second ring 12A is provided to cover the space 92A, a flow into a reaction chamber bottom 64A of a reactant gas which flows into a reaction chamber 2A can be controlled. It is preferably that an overwrap volume of the second ring 12A and the susceptor ring 3A is less to control a shielding of a heating from the heating member which is not shown in FIG. 7 to the susceptor 3A.

A thickness of the second ring 12A in the second embodiment is about 0.8 mm. This thickness can suppress a heat loss by a radiation from the susceptor 3A to the second ring 12A if at all possible.

EXAMPLES

Examples of the embodiment of the present invention are described below.

Example 1

Using the epitaxial growth device 1A (a distance H between the substrate surface and the ceiling board 21 was 9.27 mm), an epitaxial layer was deposited based on a follow growth condition.

| | |
|---|---|
| first material gas (trichlorosilane) flow | 8.5 SLM |
| second material gas (hydrogen) flow | 80.0 SLM |
| purge gas (hydrogen) flow | 15.0 SLM |
| growth time | 600.0 second |
| growth temperature | 1100.0 degrees Celsius |
| rotation rate | 20.0 RPM |

Example 2

An epitaxial layer was deposited in the same manner as in Example 1, except that a flow of the first material gas was 13.5 SLM.

Example 3

An epitaxial layer was deposited in the same manner as in Example 1, except that a flow of the first material gas was 17.0 SLM.

Comparative Example 1

An epitaxial layer was deposited in the same manner as in Example 1, except that using a conventional epitaxial growth device (a distance H between the substrate surface and the ceiling board 21 was 20 mm and the rectification grooves 75 were not provided and a susceptor ring was constructed by one member), a flow of a second material gas was 34.0 SLM and a rotation rate was 35.0 RPM.

Comparative Example 2

An epitaxial layer was deposited in the same manner as in Example 2, except that using a conventional epitaxial growth device (a distance H between the substrate surface and the ceiling board 21 was 20 mm and the rectification grooves 75 were not provided and a susceptor ring was constructed by one member), a flow of a second material gas was 34.0 SLM and a rotation rate is 35.0 RPM.

Comparative Example 3

An epitaxial layer was deposited in the same manner as in Example 3, except that using a conventional epitaxial growth device (a distance H between the substrate surface and the ceiling board 21 was 20 mm and the rectification grooves 75 were not provided and a susceptor ring was constructed by one member), a flow of a second material gas was 34.0 SLM and a rotation rate was 35.0 RPM.

Layer growth rate of each examples and comparative examples was detected. A relationship between the detected growth rate and the first material gas is shown in FIG. 8.

Figure 8:
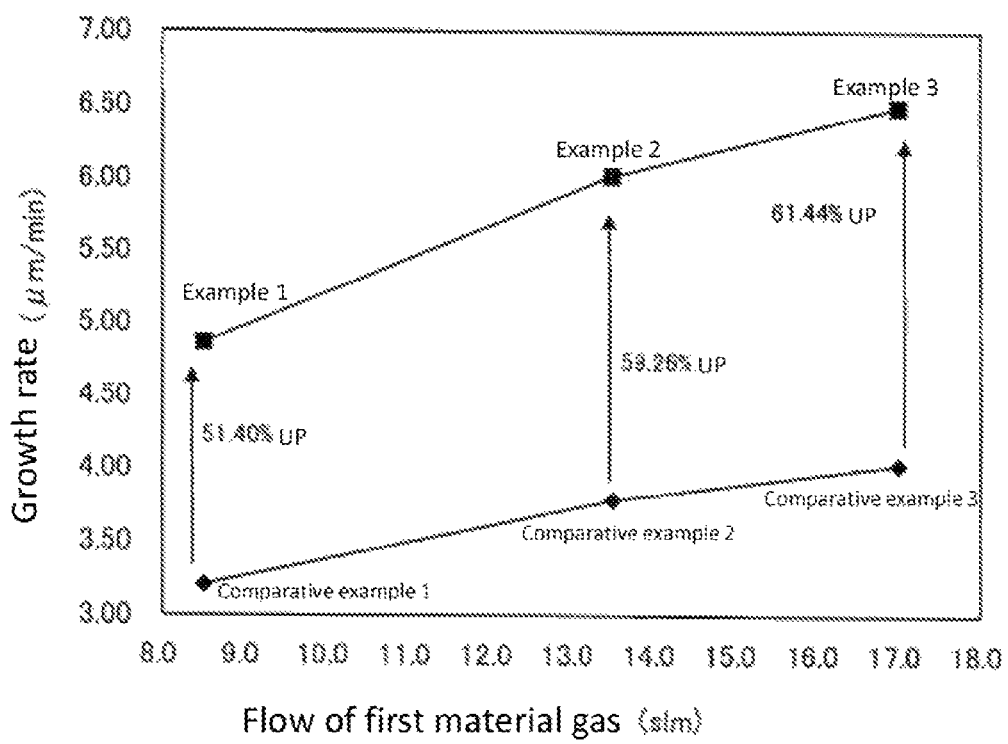
FIG. 8 is a graph showing results of examples and comparative examples.

It is understood from FIG. 8 that the growth rate was increased equal to or more than 50% thereof and the increaser the flow of the first material gas, the improvement rate was increased according to the epitaxial growth device 1A. Therefore, the growth rate was improved by using the epitaxial growth device of the present invention.

What is claimed is:

1. An epitaxial growth device comprising:
   a reaction chamber defined by a susceptor configured to support a substrate during processing;
   a ring-like support portion having a through-hole as viewed from above, the ring-like support portion having an inner wall comprising two inclined opposing face portions, each of which taper gradually toward the susceptor;
   a ceiling board which is transmissive to light disposed on the inner wall of the ring-like support portion, the ceiling board defining a height between the susceptor and the ceiling board that is substantially equal across a width of the susceptor;
   a heating unit located outside of the reaction chamber for heating a substrate set inside of the reaction chamber via the ceiling board; and
   a reactant gas-introduction unit for introducing a reactant gas into the reaction chamber in a direction parallel to a horizontal direction of the substrate, wherein a susceptor ring is provided outside a periphery of a substrate setting portion of the susceptor, the susceptor ring comprising a first ring and a second ring, the first ring located outside the periphery of the substrate setting portion and supported by a sidewall portion of the reaction chamber, the second ring set on a circular step having a recessed surface, the circular step provided within an inner circumference of the first ring.

2. The epitaxial growth device according to claim 1, wherein a distance between a center of the ceiling board and a substrate setting portion of the susceptor is less than 10 mm.

3. The epitaxial growth device according to claim 1, wherein the sidewall portion of the reaction chamber has a supply passage for supplying the reactant gas into the reaction chamber, the supply passage has a wall against which the reactant gas introduced from the reactant gas-introduction unit collides, and a plurality of rectification grooves are provided in end portions of the wall along a flow direction of the reactant gas.

4. The epitaxial growth device according to claim 3, wherein the rectification grooves are positioned to face a plurality of holes of a rectification plate provided in a line in a longitudinal direction, the rectification plate being provided at an upstream side of the supply passage.

5. The epitaxial growth device according to claim 4, wherein the holes provided in the line are formed in a plurality of areas in the rectification plate, and the rectification grooves are provided corresponding to a plurality of holes located in both of a plurality of outmost end areas of the plurality of areas.

6. The epitaxial growth device according to claim 3, wherein a plurality of centers of the respective grooves are positioned to face toward a center of the sidewall portion having a ring-like shape.

7. The epitaxial growth device according to claim 1, wherein the second ring is provided to approach a space formed between the susceptor and the first ring.

8. The epitaxial growth device according to claim 1, wherein the second ring is provided to cover a space formed between the susceptor and the first ring.

9. An epitaxial growth device comprising:
a reaction chamber defined by a sidewall portion and a bottom;
a susceptor within the sidewall portion, the susceptor having a substrate setting portion configured to support a substrate during processing, wherein a susceptor ring is provided outside a periphery of a substrate setting portion of the susceptor and within the sidewall portion, the susceptor ring comprising a first ring and a second ring, the first ring located outside the periphery of the substrate setting portion and supported by the sidewall portion, the second ring set on a circular step having a recessed surface, the circular step provided within an inner circumference of the first ring;
a ring-like support portion provided on the sidewall portion defining a circular through-hole as viewed from above, the through-hole having an inner wall with two opposing inclined face portions, each of which taper gradually toward the substrate support portion;
a light-transmissive ceiling board disposed on the inner wall of the ring-like support portion, the ceiling board defining a height between the susceptor and the ceiling board that is substantially equal across a width of the susceptor;
a first heating unit located outside of the reaction chamber for heating a substrate inside of the reaction chamber via the ceiling board;
a second heating unit located outside of the reaction chamber for heating the substrate inside of the reaction chamber via the bottom; and
a reactant gas-introduction supply passage provided in the sidewall portion for introducing a reactant gas into the reaction chamber in a direction parallel to a plane of the substrate setting portion.

10. The epitaxial growth device according to claim 9, wherein the supply passage has a wall against which the reactant gas introduced from the reactant gas-introduction unit collides.

11. The epitaxial growth device according to claim 10, wherein a plurality of rectification grooves are provided in end portions of the wall along a flow direction of the reactant gas.

12. The epitaxial growth device according to claim 9, wherein the reactant gas-introduction supply passage includes a rectification plate located in a flow path of the reactant gas.

13. The epitaxial growth device according to claim 12, wherein the rectification plate includes a plurality of holes positioned about a circumference of the susceptor.

14. The epitaxial growth device according to claim 9, wherein an exhaust passage is provided in the sidewall portion opposite the reactant gas-introduction supply passage.

15. An epitaxial growth device comprising:
a reaction chamber defined by a ring-like upper sidewall portion, a ring-like lower sidewall portion, and a bottom;
a susceptor within the reaction chamber, the susceptor having a substrate setting portion configured to support a substrate during processing, wherein a susceptor ring is provided outside a periphery of a substrate setting portion of the susceptor and within the ring-like lower sidewall portion, the susceptor ring comprising a first ring and a second ring, the first ring located outside the periphery of the substrate setting portion and supported by the ring-like lower sidewall portion, the second ring set on a recessed circular step provided within an inner circumference of the first ring;
a support portion disposed within the ring-like upper sidewall portion defining a circular through-hole as viewed from above, the support portion having two opposing inclined face portions that reduce gradually toward the substrate support portion;
a light-transmissive ceiling board disposed on one of the two opposing inclined face portions of the ring-like support portion, the ceiling board defining a height between the susceptor and the ceiling board that is substantially equal across a width of the susceptor;
a first heating unit located outside of the reaction chamber for heating a substrate inside of the reaction chamber via the ceiling board;
a second heating unit located outside of the reaction chamber for heating the substrate inside of the reaction chamber via the bottom;
a reactant gas-introduction supply passage provided in the ring-like lower sidewall portion for introducing a reactant gas into the reaction chamber in a direction parallel to a first plane of the substrate setting portion, wherein the reactant gas-introduction supply passage comprises a first supply passage disposed parallel to the first plane, and a second supply passage disposed in a second plane that is perpendicular to the first plane, wherein the ceiling board has a surface that is substantially coplanar with the first supply passage; and
an exhaust passage is provided in the ring-like lower sidewall portion opposite the reactant gas-introduction supply passage.

16. The epitaxial growth device according to claim 14, wherein the reactant gas-introduction supply passage includes a rectification plate located in a flow path of the reactant gas.

17. The epitaxial growth device according to claim 16, wherein the rectification plate includes a plurality of holes positioned about a circumference of the susceptor.

18. The epitaxial growth device according to claim 14, wherein the supply passage has a wall against which the reactant gas introduced from the reactant gas-introduction unit collides.

19. The epitaxial growth device according to claim 18, wherein a plurality of rectification grooves are provided in end portions of the wall along a flow direction of the reactant gas.

20. The epitaxial growth device according to claim 1, wherein the reactant gas-introduction supply passage comprises a plurality of first supply passages disposed parallel to the first plane, and a plurality of second supply passages disposed in a second plane that is perpendicular to the first plane, and each of the second supply passages comprise an arc-like shape that elongates in the second plane.

* * * * *